United States Patent [19]

Bujese et al.

[11] Patent Number: 4,786,576

[45] Date of Patent: Nov. 22, 1988

[54] METHOD OF HIGH RESOLUTION OF ELECTROSTATIC TRANSFER OF A HIGH DENSITY IMAGE TO A NONPOROUS AND NONABSORBENT CONDUCTIVE SUBSTRATE

[75] Inventors: David P. Bujese, Butler; Gary W. Schmidt, Park Ridge, both of N.J.

[73] Assignee: Olin Hunt Specialty Products, Inc., Palisades Park, N.J.

[21] Appl. No.: 158,168

[22] Filed: Nov. 19, 1987

Related U.S. Application Data

[63] Continuation of Ser. No. 883,797, Jul. 9, 1986, abandoned, which is a continuation-in-part of Ser. No. 848,669, Apr. 4, 1986, Pat. No. 4,661,431, which is a continuation-in-part of Ser. No. 655,346, Sep. 27, 1984, abandoned.

[51] Int. Cl.⁴ ............................................ G03G 13/22
[52] U.S. Cl. ................................. 430/126; 430/313; 430/318
[58] Field of Search ........................................ 430/126

[56] References Cited

U.S. PATENT DOCUMENTS

| | | | |
|---|---|---|---|
| T869,004 | 12/1969 | Culhane | 430/126 |
| 2,097,233 | 10/1937 | Meston | |
| 2,673,651 | 5/1953 | Copley | |
| 2,833,930 | 5/1958 | Walkup | |
| 2,910,351 | 10/1959 | Szpak et al. | 430/31 X |
| 2,966,429 | 12/1960 | Darrel et al. | |
| 3,075,866 | 1/1963 | Baker et al. | 430/31 |
| 3,355,283 | 11/1967 | Matkan | 430/126 |
| 3,650,860 | 3/1972 | Rolker, Jr. | 156/345 X |
| 3,701,070 | 1/1963 | Matthews et al. | |
| 3,758,327 | 9/1973 | York et al. | 430/126 X |
| 3,856,519 | 12/1974 | Honjo et al. | 430/126 X |
| 3,862,848 | 1/1975 | Manley | 430/126 X |
| 4,047,945 | 9/1977 | Pfister et al. | |
| 4,327,167 | 4/1982 | Tanabe | 430/31 |
| 4,364,661 | 12/1982 | Landa | 355/3 SH |
| 4,373,016 | 2/1983 | Kings et al. | 430/126 |
| 4,378,422 | 3/1983 | Landa et al. | 430/126 |
| 4,411,976 | 10/1983 | Landa et al. | 430/114 |
| 4,485,387 | 11/1984 | Drumheller | 346/140 R |

FOREIGN PATENT DOCUMENTS 48-38259 11/1973 Japan .................................. 430/126

OTHER PUBLICATIONS

"Conductive Receiver Sheets", Res. Discl. 10802, Apr. 1973, pp. 11-13.

Primary Examiner—Roland E. Martin
Attorney, Agent, or Firm—Ralph D'Alessandro

[57] ABSTRACT

A method of fabricating a toned pattern on an isolated nonabsorbent conductive receiving surface is disclosed wherein a charged electrostatic latent image area is established on an electrostatically imageable surface, and is transferred to the conductive receiving surface across a gap of between about 1 mil and about 20 mils filled with a liquid formed at least partially of a nonpolar insulating solvent in which are suspended charged toner particles.

38 Claims, 2 Drawing Sheets

METHOD OF HIGH RESOLUTION OF ELECTROSTATIC TRANSFER OF A HIGH DENSITY IMAGE TO A NONPOROUS AND NONABSORBENT CONDUCTIVE SUBSTRATE

This application is a continuation of application Ser. No. 883,797, filed July 9, 1986, now abandoned, which is a continuation-in-part of application Ser. No. 848,669 filed Apr. 4, 1986, now U.S. Pat. No. 4,661,431; which is a continuation-in-part of application Ser. No. 655,346, filed Sept. 27, 1984, now abandoned.

BACKGROUND OF THE INVENTION

This invention relates generally to a method of high resolution electrostatic transfer of a high density image to a nonporous, nonabsorbent conductive receiving surface. More specifically, it pertains to the method of transfer and the method of creating a latent image on an electrostatically imageable surface that may be repeatedly used to produce high resolution and high density images on printed circuit boards.

The production of conductive wiring patterns on an insulating substrate employing a dry film resist by use of photoimaging and other techniques to produce a printed circuit board typically employs a five step process. Regardless of whether a tenting-method or a hole-plugging method is employed, the five distinct steps have included laminating or coating a photosensitive dry film resist on at least one conductive surface of an insulating substrate, forming a wiring pattern on the dry film resist by use of artwork or a phototool and xxposing the dry film resist to actinic radiation through the transparent areas of the phototool, developing the circuit board by removing the unexposed portions of the negative working dry film resist, etching the conductive substrate from the circuit board in all non-imaged areas not beneath the desired conductive wiring pattern which is still covered with the dry film resist, and finally stripping or removing the dry film resist covering the desired wiring pattern from the non-etched portions of the conductive substrate. This five step process must be repeated for each circuit board produced.

During the exposure step in the standard dry film process, sufficient radiation exposure levels and exposure times are desired to produce straight sidewalls in the dry film resist that are the result of a pattern of the cross-linking of polymers in the dry film. These straight sidewalls should be normal to the conductor surface. Practically, however, in the standard negative working dry film photoresist print and etch process either underexposure occurs, producing a sidewall edge that undercuts the desired resist pattern, or overexposure occurs, producing a sidewall edge in the dry film photoresist that increases the width of the dry film photoresist at the base of the resist and the surface of the conductor causing a foot. Both of these conditions vary the width of the ultimate conductive pattern from that which is desired, beyond the planned and engineered tolerance or overage of the line widths in the conductor surface.

The development step during this process ideally should develop away the unexposed negative working dry film resist to produce an edge in the dry film resist on the conductor surface that is equal in width to the pattern on the phototool and normal to the conductor surface. Practically, however, either underdevelopment or overdevelopment of the dry film photoresist occurs. Underdevelopment produces a buildup of resist residue in the sidewall zone or developed channels that is sloped toward the adjacent sidewall resulting in smaller spaces between the adjacent lines than is desired. When overdevelopment occurs the unexposed film resist edge is undercut, producing larger than desired spacing between adjacent lines. Additionally, there is the potential for some rounding at the top of the resist surface sidewall edges.

This inability to accurately reproduce the phototool in the dry film resist affects the fine line resolution and reproduction characteristics of the reproduced circuit pattern. As circuit boards have become more complex and stacking of multiple boards has become prevalent, the need for higher density, finer resolution circuit patterns has evolved. Resolution has been viewed as the ability to reliably produce the smallest line and space between adjacent lines that can be reliably carried through the aforementioned five step processing. The thinness or smallness of the lines that can survive development and the narrowness of the gap or space between the adjacent lines in the circuit pattern have led to fine line resolution and reproduction standards in the printed circuit board industry calling for about 3.1 mil line and space dimensions or the development of about 6.3 line pairs per millimeter. These standards are used to define the desired density of the circuit board.

The attempt to apply the principles of xerography to transfer developed electrostatic latent images from a photoconductor's electrostatically imaged surface to a receiver surface with high resolution and high density images has encountered difficulty. The major source of this difficulty stems from the fact that circuit boards consist of a nonporous or nonabsorbent substrate, such as metal, like copper, or a plastic, like the polyester film sold under the tradename of MYLAR. This nonporous and nonabsorbent receiving surface causes the image being transferred, especially when attempted with a liquid toner, to become distorted or "squished".

Xerographic techniques solved the problem of transferring an image to absorbent receiving surfaces, such as paper, by transferring the images formed by L toner particles across a gap. The gap has either been an air, or a combination air-liquid, gap. Attempts to translate this gap transfer technology to nonporous substrates, however, resulted in image "squish" and the realization that the gap space and the voltage must be carefully controlled to produce an acceptable transferred toner image with the proper resolution and density. If the voltage and the gap space or distance between the photoconductor or the electrostatically imageable surface and the conductive receiving surface are not carefully controlled, electrical arcing across the gap will occur. This can cause pin-holes in the transferred toner image by permanently damaging the electrostatically imageable surface. This is especially significant in print and etch applications used to manufacture printed circuit boards.

Also, it has been found with nonporous receiving substrates that both the photoconductor or electrostatically imageable surface and the receiving conductive surface must be stationary at the point of transfer of the toner image to achieve a transferred image of high resolution.

An additional problem is presented in transferring the developed latent image electrostatically to a nonabsorbent substrate, such as copper. The metal or copper surface forming the conductive receiving surface, as well as the electrostatically imageable surface, is uneven so that the spacing between the electrostatically imageable surface and the conductive receiving surface must be sufficient to avoid contact between the uneven surfaces of the photoconductor and the conductive receiving surface.

These problems are solved in the process of the present invention by providing a method of making a transfer of a developed electrostatic latent image from an electrostatically imageable surface across a liquid-filled gap to a conductive nonabsorbent, nonporous receiving surface to produce multiple printed circuit boards with a desired conductive pattern from a single persistent latent image. The electrostatically imageable surface may be either a photoconductor or a permanent master.

SUMMARY OF THE INVENTION

It is an object of the present invention to provide a method for achieving non-contact high resolution electrostatic transfer of a developed high density electrostatic latent image directly to a nonporous and nonabsorbent substrate.

It is another object of the present invention to obtain the high density electrostatic latent image through the use of a dry film resist that serves as a permanent and reuseable master.

It is another object of the present invention that the method of electrostatic transfer can be utilized with a photoconductor or a permanent master as the electrostatically imageable surface.

It is another object of the present invention to transfer the developed high density image from the electrostatically imageable surface across a liquid-filled gap to a conductive receiving surface so that the liquid serves as the transfer medium.

It is still another object of the present invention to provide a method that permits the latent image and the transferred image to be capable of resolving about 3.1 mil line and space.

It is a feature of the present invention that the quality of the image density, the thickness or height of the toner particles forming the image and the thickness of the layer of liquid serving as the transfer medium in the gap between the electrostatically imaged surface and the conductive receiving surface are controlled by the spacing of the gap and the voltage applied to create the electric field between the electrostatically imageable surface and the conductive receiving surface.

It is another feature of the present invention that the conductive backing material or the substrate supporting the electrostatically imageable surface is electrically grounded and the conductive receiving surface is electrically isolated from ground.

It is still another feature of the present invention that the developed latent image is transferred directly from the electrostatically imageable surface to the conductive receiving surface through a nonconductive dielectric insulating fluid by the migration of the individual toner particles comprising the toned image through the liquid to the conductive receiving surface.

It is yet another feature of the present invention that the distance or spacing of the gap between the electrostatically imageable surface and the conductive receiving surface is between about 1 mil and about 20 mils and the distance is maintained by the use between the two surfaces of spacer means which are electrically isolated from ground.

It is still another feature of the present invention that conventional photoconductors or permanent masters may be used as the electrostatically imageable surface to produce large quantities of printed circuit boards by eliminating the need for a dry film or liquid photoresist for each circuit board copy.

It is yet another feature of the present invention that the transfer of the electrostatic latent image to the conductive receiving surface is accomplished by directly applying D.C. voltage to the conductive receiving surface, rather than corona charging.

It is a further feature of the present invention with a photoconductor used as the electrostatically imageable surface that an additional exposure is required to produce each additional latent image.

It is an advantage of the method of the present invention that high resolution transfer of the toner particles forming the developed latent image is obtained on the conductive receiving surface without image distortion.

It is another advantage of the present invention that there is no damage or abrasion to the electrostatically imageable surface during the process so that the surface may be continually reused.

It is still another advantage of the present invention that high resolution transfer is achieved because there is no contact between the developed toner particles on the electrostatically imageable surface and the conductive receiving surface.

It is yet another advantage of the present invention that the power requirements can be reduced to accomplish the electrostatic transfer because of the use of direct applied voltage, rather than corona charging which causes air ionization.

It is still another advantage of the present invention that a faster and lower cost method of making printed circuit boards is achieved because of the elimination of the repeated exposure and development steps required of dry film or liquid photoresists for each circuit board.

These and other objects, features and advantages are obtained by the use of the method of fabricating a toned pattern on an isolated nonabsorbent conductive surface by first establishing a developed electrostatic latent image on an electrostatically imageable surface, developing the latent image with charged toner particles, and then transferring charged toner particles across a liquid filled gap comprised at least partially of a nonpolar insulating solvent to create an imaged area on a conductive receiving surface while the gap is maintained between at least about 1 mil and about 20 mils at the point of transfer of the toner particles forming the image.

BRIEF DESCRIPTION OF THE DRAWINGS

The objects, features and advantages of the invention will become apparent upon consideration of the following detailed disclosure of the invention, especially when it is taken in conjunction with the accompanying drawings wherein.

DETAILED DESCRIPTION OF THE PREFERRED EMBODIMENT

Figure 1:
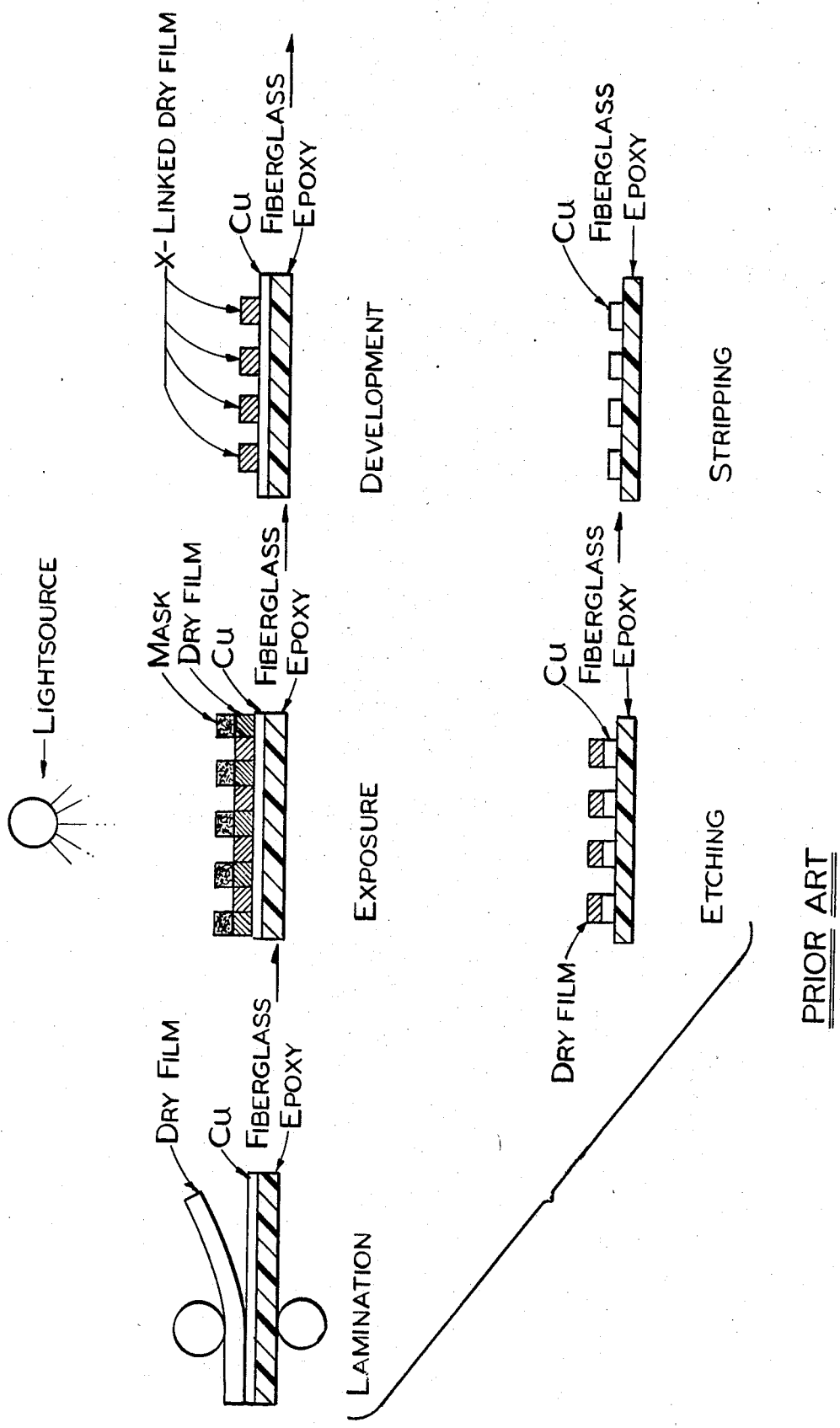
FIG. 1 is a diagrammatic illustration of the prior art print and etch printed circuit board fabrication steps.

FIG. 1 shows the standard five step process that has been previously employed in the production of printed circuit boards. Each one of the circuit boards produced has routinely required the application of a dry film to a conductive substrate, such as copper, that is laminated to a nonconductive substrate, such as fiberglass epoxy, with pressure and heat. A mask is then applied over the dry film to permit selective exposure from a light source or other source of actinic radiation to produce the desired pattern. Development takes place by removing the uncross-linked dry film, leaving only cross-linked dry film with the desired pattern. Etching with an acid etchant removes the conductive copper substrate from between the areas of cross-linked dry film. Finally, stripping the dry film from the remaining conductive copper substrate exposes the desired circuit pattern. This is commonly known as the print and etch process.

In the proces of the present invention which is diagrammatically illustrated in FIG. 2, however, a permanent master is produced with the use of a photosensitive material or coating, such as a dry film or liquid photoresist over a conductive substrate. Thereafter, dry film or liquid photoresist is not employed to produce the desired conductive wiring patterns from the permanent master on the product circuit boards.

Figures 2A, 2B:
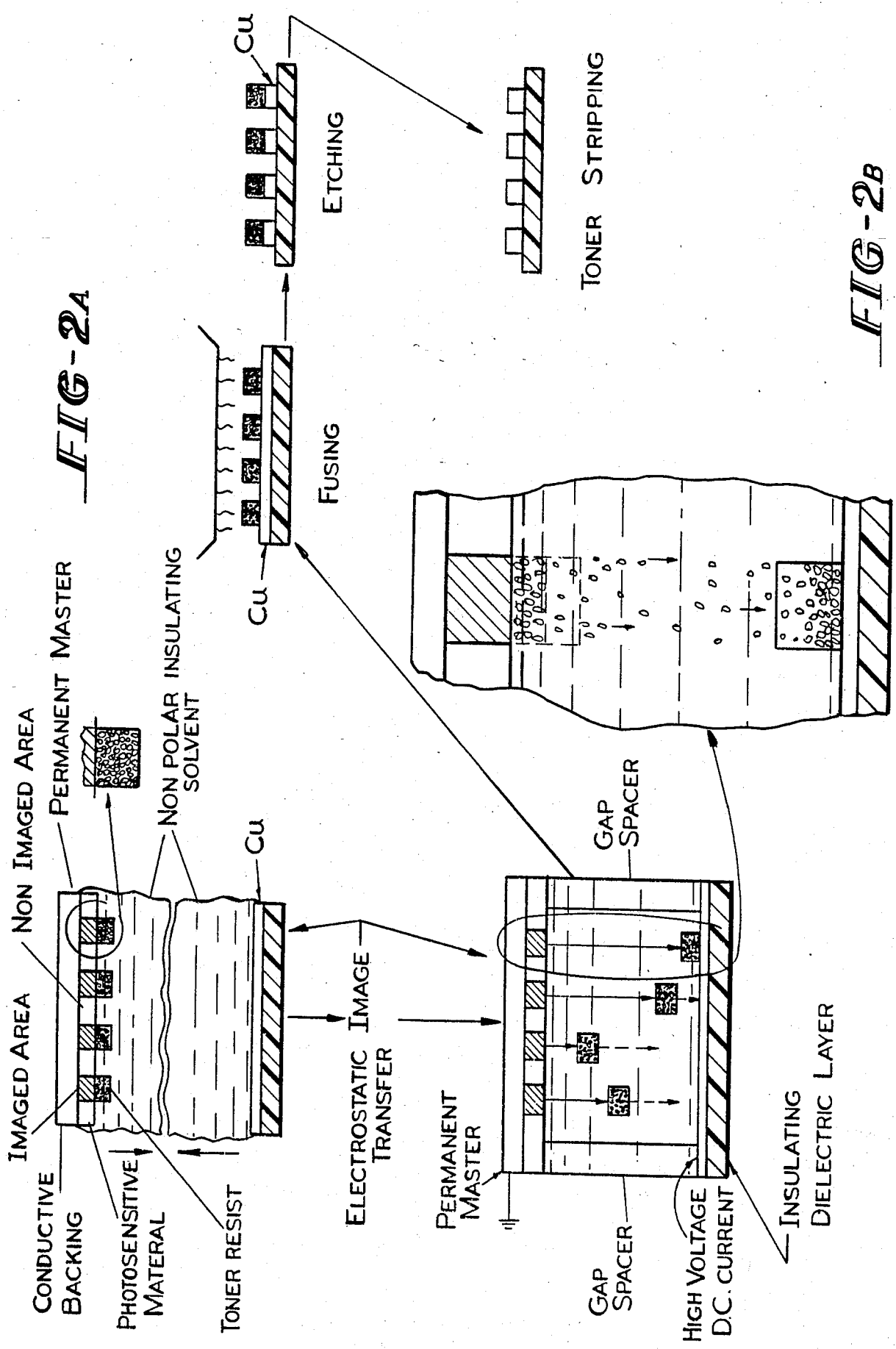
FIG. 2a is a diagrammatic illustration of the process of the present invention employing a permanent master that is reusable to produce multiple copies of a desired conductive wiring pattern on an insulating dielectric layer by the migration of charged toner particles from the master across a liquid-filled gap to a conductive receiving surface and FIG. 2b is an enlarged diagrammatic illustration of the migration of charged toner particles from one toned image on the master across liquid-filled gap to a conductive receiving surface.

The permanent master is used as an electrostatically imageable surface as shown in FIG. 2a. A conductive backing has a photosensitive material, such as a dry film or liquid photoresist, applied to it on at least one side. This photosensitive material undergoes a change in resistivity upon exposure to actinic radiation because of the cross-linking of the polymers in the material. A persistent image is formed on the photosensitive material by actinicly radiating through a mask or by "writing" the desired pattern with a digital laser pen. Either method produces electrostatic contrasts or differences in the resistivity between imaged and non-imaged areas on the photosensitive material. The electrostatically imageable surface is isolated from ground and charged with a corona charging device to produce the charged latent image.

The electrostatically imageable surface is then developed by the application, through surface adsorption, of a liquid comprised at least partially of a nonpolar insulating solvent that serves as a liquid carrier for toner particles that are charged oppositely to the charge of the electrostatically imageable surface. This application can be accomplished by flooding, dipping or spraying the electrostatically imageable surface. The charged toner particles are directed to the latent image area of the electrostatically imageable surface to form or develop the latent image seen in FIG. 2a and its accompanying enlargement in FIG. 2b.

Thus developed, the image is formed on the electrostatically imageable surface according to the persistent latent image's pattern on the permanent master. The developed image thus is ready for transfer to an electrically isolated conductive receiving surface to produce a circuit board with the desired conductive wiring pattern.

The conductive receiving surface is first coated with a liquid that comprises at least partially a nonpolar insulating solvent. The solvent is the same as or an equivalent to that which is applied to the electrostatically imageable surface and may be applied by sponge, squeegee, rubber roller or other means capable of applying a thin continuous film. The solvent should preferably have a high resistivity and a low viscosity to permit the charged toner particles to migrate or flow through the solvent from the charged electrostatic latent image area on the electrostatically imageable surface to the conductive receiving surface. The solvents are generally mixtures of $C_9$-$C_{11}$ or $C_9$-$C_{12}$ branched aliphatic hydrocarbons sold under the tradename Isopar G and Isopar H, respectively, manufactured by the Exxon Corporation, or equivalents thereof. The electrical resistivity is preferably on the order of at least about $10^9$ ohm-centimeters and the dielectric constant preferably is less than about $3\frac{1}{2}$. The use of nonpolar insulating solvents with these characteristics helps to ensure that the pattern of charged toner particles is not dissipated.

After a D.C. voltage optimally between about 200 to about 1200 volts is applied to the conductive receiving surface to establish an electric field between the electrostatically imageable surface and the conductive receiving surface, the surfaces are moved close enough together to create a completely liquid transfer medium by the contact of the two layers of nonpolar insulating solvent. This is illustrated in FIG. 2a just prior to the joining of the two layers of solvent. The first liquid surface of the first layer of nonpolar insulating solvent on the electrostatically imageable surface and the second liquid surface of the second layer of nonpolar insulating solvent on the conductive receiver surface join together to fill the gap between the two surfaces. The voltage necessary to establish the electric field between the electrostatically imageable surface and the conductive receiving surface operably can be between about 200 to about 3500 volts, out is preferably between about 200 and about 1500 volts and optimally is as stated above. The ability to transfer a high resolution image is a function of the combined factors of the toner, the liquid carrier, the gap spacing and the voltage applied. Generally, a greater gap spacing requires a higher voltage to effect a high quality, high resolution image transfer.

A uniform spacing across this gap is maintained by the use of spacer strips or gap spacers, seen in FIG. 2a, which are electrically isolated from ground. The developed image from the electrostatically imageable surface is transferred across the gap through the liquid medium to the conductive surface to form an imaged area in a pattern similar to that of the phototool where the transferred toner particles are present and non-imaged areas where the particles are absent.

The transfer of the developed image across the liquid-filled gap takes place at the point of transfer by maintaining a first plane taken through the electrostatically imageable surface parallel to a second plane taken through the conductive receiving surface. The electrostatically imageable surface and the conductive receiving surface at the point of transfer should have no relative motion occuring between them, although the point of transfer could be a stationary or rolling point of transfer. A drum or web, or a stationary flat surface could be employed for the electrostatically imageable surface, transferring the developed image across the gap to a flat and stationary, or a moving conductive receiving surface. The moving conductive receiving surface could be a rolling drum or a web or other appropriate means. The electrostatically imageable and conductive receiving surfaces must be held in place at the point of transfer, such as by a vacuum, or alternately could be accomplished by magnetically or electrostatically holding the surfaces in place across the gap.

This gap between the electrostatically imageable surface and the conductive receiving surface is preferably maintained between at least about 3 mils (0.003 inch) and about 10 mils (0.010 inch) by the use of spacer strips of the desired thickness, although high quality images have been transferred across gaps as large as about 20 mils (0.02 inch). By maintaining the gap greater than about 3 mils, the inconsistencies or irregularities in the two surfaces are separated sufficiently to prevent any contact from occurring between the two surfaces and any possible abrasion or scratching from occurring to the surface of the master or electrostatically imageable surface.

The spacer strips or gap spacers, shown in FIG. 2a, are selected from either conductive materials, such as metal, or nonconductive materials, such as polyester film sold under the tradename MYLAR, or cellophane. The strips must be electrically isolated from ground and be of uniform thickness. The uniform thickness insures that a uniform gap spacing is obtained between the electrostatically imageable surface and the conductive receiving surface. The spacer strips preferably should be placed outside of the image area.

By applying the first and second layers of nonpolar insulating solvent in sufficient thickness to the electrostatically imageable surface and the conductive receiving surface to fill the gap therebetween, the first liquid surface and the second liquid surface of the first and second layers of the nonpolar insulating solvent join together to form a continuous liquid transfer medium at the point of transfer of the charged toner particles between the electrostatically imageable surface and the conductive receiving surface. By traveling through a continuous sea of liquid transfer medium, there are no surface tension forces which the charged toner particles must overcome that could hinder their migration from the electrostatically imageable surface to the conductive receiving surface. The charged toner particles are directed through the liquid transfer medium formed by the joining of the two layers of nonpolar insulating solvent at this point of transfer by the electric field that is applied at the point of transfer.

As is diagrammatically illustrated in FIG. 2a, and in an enlarged illustration in FIG. 2b the charged toner particles with their predetermined charge, migrate from the oppositely charged cross-linked imaged area with the photosensitive material on the electrostatically imageable surface to the conductive receiving surface as individual or grouped particles. The conductive receiving surface is laminated onto an insulating dielectric layer, such as a fiberglass epoxy. The applied electric transfer field causes the toner particles to migrate through the liquid transfer medium of the nonpolar insulating solvent and attach to the conductive receiving surface to create imaged areas where the toner particles are present and non-imaged areas where they are absent.

Since the photosensitive material, such as a dry film or liquid photoresist, on the electrostatically imageable surface acts as a master electrostatic image plate, and the resistivity difference between the imaged and non-imaged areas on the electrostatically imageable surface remains relatively constant in most instances for sustained periods of time dependent upon the photoresist used, multiple copies can be made by the electrostatic transfer method. To repeat the procedure, excess nonpolar insulating solvent and excess toner particles on the electrostatically imageable surface should be removed, such as by rinsing, followed by a physical wiping or squeeging. Any residual electric charge on the electrostatically imageable area should be discharged, such as by charging the photosensitive material's surface with an alternating current corona.

The desired electrostatic latent image pattern remains in the photosensitive material by using the material's ability to retain differences in resistivity for relatively long periods of time after having been exposed to actinic radiation to form cross-linked imaged areas of increased resistivity and non-imaged areas unexposed to the actinic radiation which remain the less resistive or background areas. The photosensitive material, such as a dry film resist, typically is formed of polymers which become cross-linked to form the imaged areas of greater electrical resistivity that may be an order of magnitude more dielectric than the background or unexposed areas. These imaged areas are the only areas of increased resistivity that hold a high voltage charge when charged by a D.C. charge corona, if the conductive backing is electrically grounded. The non-imaged or background areas with the lesser electrical resistivity very rapidly release or leak the charge through the grounded conductive backing. The charged toner particles suspended in the nonpolar insulating solvent are oppositely charged to these latent imaged areas so that the charged toner particles are attracted to them. This then permits the transfer of these charged toner particles from the electrostatically imageable surface across the liquid gap to the conductive receiving surface as previously described.

Once the toner image is formed by the toner particles in the imaged area on a conductive receiving surface, the particles are fused to the conductive receiving surface by heating, as illustrated diagrammatically in FIG. 2a. The heat can be provided either by the use of an oven or directed warm air through an air slot so that the heat is supplied for a finite period of time sufficient to reach the temperature at which the binder or polymer forming the toner particles will solvate in the liquid which is entrained within the transferred image. The fusing, for example, can occur for about 15 to about 20 seconds at a temperature greater than about 100° C. and up to about 180° C.

Thereafter the non-imaged areas are etched, as illustrated in FIG. 2a to produce the desired conductive wiring pattern in the unetched conductive receiving surface which is overcoated with the toner particles. The etching step utilizes a solution that cannot remove the conductor material from the areas of the conductive receiving surface protected by the toner particles, but does attack and remove the conductor material from the areas unprotected by the toner particles. The particular type of etchant employed depends, in part, on the conductor material being etched and the type of resist being used, so that both acid and very mild alkaline etching solutions are possible for use. For example, when the conductive receiving surface is copper, an etchant comprising acidic cupric chloride is preferably used.

The final step in the electrostatic transfer process to form the copy is the stripping step, illustrated in FIG. 2a. During this step the toner particles are appropriately removed or stripped from the imaged areas, such as by rinsing with methylene chloride, acetone, an alkaline aqueous solution or other suitable solution.

In order to exemplify the results achieved, the following examples are provided without any intent to limit the scope of the instant invention to the discussion therein. The examples are intended to illustrate the manner in which a permanent master with a persistent conductive latent image on the electrostatically imageable surface can be obtained and how the gap spacing and voltage levels can be varied to achieve successful electrostatic image transfer. The examples also illustrate, whether a photoconductor or a permanent master is used as the electrostatically imageable surface, how successful electrostatic image transfer can be achieved without the need for the application of a dry film or liquid resist to each conductive receiving surface prior to the transfer of the developed latent image from the electrostatically imageable surface.

EXAMPLE 1

A liquid toner was prepared for use by preparing the following raw materials in the amounts shown in a high speed disperser:

| Raw Material | Amount (grams) | Description |
|---|---|---|
| ISOPAR H | 1248.6 | solvent-carrier |
| UNIREZ 7059 (UNION CAMP) | 439.2 | alcohol insoluble maleic modified rosin ester |
| Allied AC Polyethylene 6A | 307.8 | linear polyethylene |
| BAKELITE DPD 6169 (UNION CARBIDE) | 1584.0 | ethylene-ethylacrylate copolymer 20% shock-cooled suspension in ISOPAR H |
| phthalocyanine green | 229.2 | coloring agent - pigment |
| Alkali Blue G | 158.4 | coloring agent - pigment |

These components were mixed at a speed of 8000 rpm for 10 minutes while maintaining the temperature of the mixture between 160° and 220° F.

606 Grams of an amphipathic graft copolymer system was prepared by mixing 104.3 grams of lauryl methacrylate and 44.7 grams of methyl methacrylate, both available from Rohm and Haas, and 3.0 grams of azobis isobutonitrile, available from DuPont as Vazo 64.

Next 108.2 grams of an amphipathic copolymer stabilizer was prepared according to the procedure described hereafter. In a 1 liter reaction flask equipped with a stirrer, a thermometer and a reflux condenser is placed 400 grams of petroleum ether (b.p. 90°-120° C.) and the same is the heated at atmospheric pressure to a moderate rate of reflux. A solution is made of 194 grams lauryl methacrylate, 6.0 grams of glycidyl methacrylate and 3.0 grams of benzoyl peroxide paste (60 percent by wt. in dioctyl phthalate) and placed in a 250 ml. dropping funnel attached to the reflux condenser. The monomer mixture is allowed to drip into the refluxing solvent at such a rate that it requires 3 hours for the total amount to be added. After refluxing 40 minutes at atmospheric pressure beyond the final addition of monomer, 0.5 grams of lauryl dimethyl amine is added and the refluxing is continued at atmospheric pressure for another hour. Then 0.1 gram hydroquinone and 3.0 grams methacrylic acid are added and refluxing continued under a nitrogen blanket until about 52 percent esterification of the glycidyl groups is effected (about 16 hours). The resulting product is slightly viscous straw-colored liquid.

345.8 Grams of ISOPAR H from Exxon Corporation was added to the 108.2 grams of the amphipathic copolymer stabilizer and the aforementioned quantities of lauryl methacrylate, methyl methacrylate and azobis isobutinitrile to form the 606 grams of amphipathic graft copolymer system. Polymerization was effected by heating this solution to about 158° F. under a nitrogen atmosphere for about 4 to about 20 hours.

606 Grams of additional ISOPAR H was added to the above solution and mixing was continued for 10 minutes at 8000 RPM while the temperature was maintained between about 160° F. and 180° F.

Finally, 3578 grams of ISOPAR H was added, the mixer speed reduced to 1000-2000 RPM, and mixing continued for 30 minutes. During this last step, the temperature of the mixture was maintained between 120° F. and 140° F.

Next a liquid toner concentrate was prepared by combining the following in a static attritor-type mill:

| Material | Amount (grams) | Description |
|---|---|---|
| Predispersion Mix | 1022.7 | liquid toner predispersion |
| Carnauba wax polymer dispersion | 58.3 | wax |
|  | 83.3 | amphipathic polymer dispersion as prepared in Ex. XI of Kosel (U.S. Pat. No. 3,900,412) |
| Neocryl S-1004 | 62.4 | amphipathic polymer dispersion available from Polyvinyl Chemical Industries, Div. of Beatrice 730 Main St. Wilmington, MA 01887 |
| ISOPAR H | 694.5 | solvent-carrier |

These components were milled for three hours at 300 RPM and a temperature of about 75° F. to create a toner concentrate. The toner concentrate was futher diluted to about 1 to about 2 percent solids to create the workig solution for use in electrostatic imaging.

A cadmium sulfide photoconductor overcoated with a MYLAR polyester film layer (typical of the NP process type) was corona charged and then light exposed to a circuit trace pattern from about 0.75 to about 2.70 microjoules/square centimeter in a Canon Model 1824 copier to create a charged latent image. The changed latent image was developed by applying the liquid toner to the overcoated cadmium sulfide photoconductor that is the electro statically imageable surface. The electrostatically imageable surface of this photoconductor is mounted over an inner aluminum substrate drum. The drum was removed from the copier. A high voltage power source had its ground lead connected to the interior of the drum and its positive lead connected to the copper surface of the conductive receiving surface. Cellophane spacer strips or gap spacers were used between the drum and the conductve surface. The conductive surface was coated with a liquid that included the nonpolar insulating solvent that was squeegeed onto the conductive surface. The electrostatically imageable surface of the drum was coated during the development step. 1000 Volts D.C. current was applied and the gap was set at 10 mils.

The cadmium sulfide drum was manually rolled across the spacer strips to create points of transfer of the latent image from the electrostatically imageable surface to the conductive receiving surface of copper. The image transfer was successful with the image possessing excellent resolution and good density.

EXAMPLE 2

The cadmium sulfide photoconductor drum of Example 1 was cleaned and dried and reimaged as in Example I. The liquid transfer medium was applied to the conductive receiving surface. 500 Volts of D.C. voltage was applied and the same gap space was set as in Example 1. The image transfer was successful, but the amount of the transferred toner particles forming the transferred image was less than the amount in Example 1 and was very light over the entire image area. There appeared to be insufficient voltage applied to transfer the majority of the toner particles over a 10 mil gap.

EXAMPLE 3

The same steps and liquid transfer medium as employed in Example 2 were repeated. The conductive receiving surface was wetted with the liquid transfer medium by applying to the conductive receiving surface with a squeegee. The spacer strips were set at 3 mils to achieve a uniform 3 mil separation between the two surfaces and a voltage of 1000 volts was employed. A clear high resolution image with good density was obtained but some void areas appeared in the image. The image was uniform and distinct.

EXAMPLE 4

The same steps and liquid transfer medium were employed as in Example 3, but the gap spacers were 3 mil thickness to establish the 3 mil gap between the electrostatically imageable surface and the conductive receiving surface. 200 Volts D.C. current was applied to establish the electric field. A very clear high resolution image was transferred from the electrostatically imageable surface to the conductive receiving surface, which exhibited good reflectance image density. The density of the pad areas and line traces, however, was somewhat less than that achieved in Example 3 because all of the toner particles apparently were not transferred.

EXAMPLE 5

The same steps and liquid transfer medium were employed as used in Example 2, but the liquid was squeegeed on. The gap spacers were 1 mil thick to establish a 1 mil gap between the electrostatically imageable surface and the conductive receiving surface. 1000 Volts D.C. was applied to create the electric field. The transferred image had good image density, but there were many hollow spots due to arcing. Some image distortion was present, apparently due to the closeness of the two surfaces and the resultant "squishing" of the toner particles. The use of a system, such as a vacuum holddown system, which permits the receiving substrate to be held rigidly flat would have reduced the image distortion. Most of the transferred image was not distorted.

EXAMPLE 6

A 4"×5" electrically conductive substrate of copper mounted on a glass epoxy support substrate known as FR 4, was selected as the conductive substrate for use in making the electrostatically imageable surface of the permanent master. The copper substrate was checked for need of cleaning or degreasing. If necessary, the substrate can be cleaned with methyl chloride, methylene chloride or trichloroethylene to promote good adhesion of the photoresist to the cleaned surface during the subsequent lamination step. In this particular instance cleaning was not necessary. DuPont Riston 215 dry film photoresist was laminated to the substrate as the photosensitive material. The lamination was accomplished with the use of a Western Magnum Model XRL-360 laminator made by Dynachem of Tustin, CA. The lamination was carried out at a roll temperature of about 220° F. and a speed of about six feet per minute. A protective top layer of approximately 0.001 inch thick polyethylene terephthalate, hereafter PET, film was retained over the dry film photoresist of the copper/Riston 215 laminate.

The laminate was exposed to actinic radiation through a negative phototool using the Optic Beam 5050 exposure unit manufactured by Optical Radiation Corporation. The exposure was accomplished after the laminate cooled to room temperature following the laminating process. The exposure level was approximately 250 millijoules for about 60 seconds. The phototool was a Microcopy Test Target T-10 resolution test chart, with groups of bars varying from 1.0 cycles or line pairs per millimeter to 18 cycles or line pairs per millimeter, sold by Photographic Sciences, Inc.

The exposed electrostatically imageable surface was then allowed to cool to room temperature for about 30 minutes, thereby permitting cross-linking in the dry film to complete. The protective layer of PET film was peeled away. The copper substrate was grounded and the electrostatically imageable surface was corona charged so that the imaged area received a positive charge. After a short delay of about a second or more to allow background areas to discharge, the charged persistent image was then electrophotographically developed with liquid toner of Example 1. Excess toner particles were rinsed from the developed permanent master with Isopar H solvent carrier without allowing the toner to dry. The developed persistent image on the electrostatic master was then ready for transfer to a conductive receiving surface.

The electrostatic master thus formed was laid flat on a generally flat working surface. MYLAR ® polyester spacer strips were placed along a pair of parallel and opposing edges of the master outside of the developed image area to a thickness of about 10 mils.

A flexible conductive receiving surface of ½ ounce copper foil laminated to a 1 mil thick Kapton ® polyimide insulating layer was wrapped around and secured by lap taping the edges to a 1½ inch diameter drum. The receiving surface was wet with a layer of Isopar H solvent carrier by immersing the cylinder. Alternatively, the receiving surface could be coated by pouring the liquid thereover.

An electrical potential of about 1000 volts was established to create an electric field across an approximately 10 mil gap. The conductive receiving surface of copper foil was charged with positive polarity with respect to the electrically conductive copper substrate of the master for use with the negatively charged toner particles.

The 1½ inch diameter drum with the conductive receiving surface secured thereto was rolled over the spacer strips on the edges of the master. As the roller passed over the master at each discrete point of transfer the toner particles were transferred from the master to the conductive receiving surface. The transferred image displayed excellent resolution up to about 3.6 line pairs per millimeter. It appeared as though 100% of the toner particles were transferred to the conductive receiving surface.

The conductive receiving surface was then exposed to a fan for up to about 30 seconds to dry the non-imaged areas that comprise the background areas. The non-imaged areas should be dried while the imaged areas remain wet so the polymers in the toner particles can solvate in the solvent carrier and not run outside of the imaged areas. An air knife can also be used to effect the drying of the non-imaged areas.

The transferred image on the conductive receiving surface was then fused by placing in an oven for about 30 seconds. The temperature of the oven prior to opening was about 180° C. The fusing is accomplished through a temperature ramping that effectively occurs when the oven door is opened to place the conductive receiving surface inside because of the resultant temperature drop within the oven. The oven temperature gradually increases to the approximate 180° C. temperature level after the oven door is closed again.

EXAMPLE 7

The permanent master of Example 6 was cleaned and dried. The same liquid toner and the same charging technique were employed to electrophotographically develop the charged persistent image as in Example 6.

The developed electrostatic master was laid on a generally flat working surface and MYLAR ® polyester spacer strips were used as in Example 6 to create a thickness of about 15 mils. A flexible copper foil conductive receiving surface was mounted about the 1½ inch drum and wetted as described in Example 6. An electrical potential of about 1000 volts was established as in Example 6 to create the electric field.

The 1½ inch diameter drum was rolled over the spacer strips on the edges of the master to effect the transfer of the toner particles to the conductive receiving surface. The transferred image displayed excellent resolution up to about 5.0 line pairs per millimeter with very slight distortion. It appeared as though about 70-80% of the toner particles were transferred to the conductive receiving surface.

The transferred image was then dried and fused as in Example 6.

EXAMPLE 8

The permanent master of Example 6 was cleaned and dried. The same liquid toner and the same charging technique were employed to electrophotographically develop the charged persistent image as in Example 6.

The developed electrostatic master was laid on a generally flat working surface and MYLAR ® polyester spacer strips were used as in Example 6 to create a thickness of about 20 mils. A flexible copper foil conductive receiving surface was mounted about the 1½ inch drum and wetted as described in Example 6. An electrical potential of about 1000 volts was established as in Example 6 to create the electric field.

The 1½ inch diameter drum was rolled over the spacer strips on the edges of the master to effect the transfer of the toner particles to the conductive receiving surface. The transferred image displayed excellent resolution up to about 4.0 line pairs per millimeter with slight distortion. It appeared as though about 50-60% of the toner particles were transferred to the conductive receiving surface.

The transferred image was then dried and fused as in Example 6.

EXAMPLE 9

The permanent master of Example 6 was cleaned and dried. The same liquid toner and the same charging technique were employed to electrophotographically develop the charged persistent image as in Example 6.

The developed electrostatic master was laid on a generally flat working surface and MYLAR ® polyester spacer strips were used as in Example 6 to create a thickness of about 25 mils. A flexible copper foil conductive receiving surface was mounted about the 1½ inch drum and wetted as described in Example 6. An electrical potential of about 1500 volts was established as in Example 6 to create the electric field.

The 1½ inch diameter drum was rolled over the spacer strips on the edges of the master to effect the transfer of the toner particles to the conductive receiving surface. The transferred image was distorted and inconsistent. It appeared as though about 30-40% of the toner particles were transferred to the conductive receiving surface.

The transferred image was then dried and fused as in Example 6.

EXAMPLE 10

The permanent master of Example 6 was cleaned and dried. The same liquid toner and the same charging technique were employed to electrophotographically develop the charged persistent image as in Example 6.

The developed electrostatic master was laid on a generally flat working surface and MYLAR ® polyester spacer strips were used as in Example 6 to create a thickness of about 5 mils. A flexible copper foil conductive receiving surface was mounted about the 1½ inch drum and wetted as described in Example 6. An electrical potential of about 800 volts was established as in Example 6 to create the electric field.

The 1½ inch diameter drum was rolled over the spacer strips on the edges of the master to effect the transfer of the toner particles to the conductive receiving surface. The transferred image displayed excellent resolution up to about 5.6 line pairs per millimeter with a consistent image pattern. It appeared as though about 50% of the toner particles were transferred to the conductive receiving surface.

The transferred image was then dried and fused as in Example 6.

While the preferred method in which the principles of the present invention have been incorporated is shown and described above, it is to be understood that the present invention is not to be limited to the particular details or methods thus presented, but, in fact, widely different means and methods may be employed in the practice of the broader aspects of this invention.

For example, to effect transfer the electric field established between the electrostatically imageable surface and the conductive surface can be charged with either positive or negative polarity, depending upon the charge of the toner particles, to direct the charged toner particles across the liquid medium. Charged toner particles of negative polarity will be attracted to a positively charged conductive receiving surface or will be repelled by a negative back charging of the electrostatically imageable surface. If charged toner particles of positive polarity are used, they will be attracted to a negatively charged conductive receiving surface or repelled by a positive back charging of the electrostatically imageable surface. The nonpolar insulating solvent can equally well be mineral spirits, as long as it possesses high resistivity and low viscosity.

The gap spacing can equally well employ a web-to-web arrangement that will hold the electrostatically imageable surface and the conductive receiving surface at the desired distance.

The electric field can be established in several ways. For example, with a conductive receiver surface, such as the copper laminate, or in the case of a dielectric material, such as MYLAR polyester film, backed by a conductive surface the electric field is created by direct charging. Where a dielectric receiving surface, such as MYLAR polyester film, is used front or back charging via conventional corona charging or roller charging can be employed.

The electrostatically imageable surface can be a photoconductor, such as a cadmium sulfide surface with a MYLAR polyester film or a polystyrene or a polyethylene overcoating, a selenium photoconductor surface, or suitable organic photoconductors such as carbazole and carbazole derivatives, polyvinyl carbazole and anthracene. Where the electrostatically imageable surface uses a persistent latent image as a permanent master, the surface can be zinc oxide, or organic photoconductors developed with toner which is fused onto the master, or a dry film or liquid photoresist.

The type of photosensitive material applied to the conductive backing to make the permanent master may vary as long as it is permanently imageable and possesses the correct resistivity characteristics. For example, where dry film resists are used, the films may be aqueous, semi-aqueous or solvent based. Photoconductive insulating films of zinc oxide dispersed in a resin binder may also be used.

The process disclosed herein has been discussed in the context of producing printed circuit boards. It should be noted, however, that the electrostatic image transfer process from a permanent master is equally well acceptable for use in the production of labels, high speed production of documents and photochemical machining or milling.

The scope of the appended claims is intended to encompass all obvious changes in the details, materials and arrangements of parts which will occur to one of skill in the art upon a reading of the disclosure.

Having thus described the invention, what is claimed is:

1. A method of fabricating a toned pattern on an electrically isolated nonabsorbent conductive receiving surface, comprising the steps of:
   (a) establishing a charged electrostatic latent image area on an electrostatically imageable surface;
   (b) developing the electrostatic latent image area by applying to the electrostatically imageable surface charged tones particles of a predetermined height suspended in a liquid comprised at least partially of a nonpolar insulating solvent to form a first liquid layer with a first liquid surface, the charged toner particles being directed to the latent image area of the electrostatically imageable surface to form a developed latent image;
   (c) applying to the conductive receiving surface a liquid comprised at least partially of a nonpolar insulating solvent to form a second liquid layer with a second liquid surface;
   (d) establishing an electric field between the electrostatically imageable surface and the conductive receiving surface by connecting a D.C. voltage directly to the conductive receiving surface;
   (e) placing the conductive receiving surface adjacent to the electrostatically imageable surface so that a gap is maintained therebetween and the first liquid surface contacts the second liquid surface to create a liquid transfer medium across the liquid-filled gap, the liquid-filled gap being of a depth greater than the height of the toner particles;
   (f) transferring the developed latent image from the electrostatically imageable surface at a point of transfer through the liquid to the conductive receiving surface to form a transferred toner particle image in an imaged area and define non-imaged area where toner particles are absent;
   (g) maintaining the gap during transfer of the developed latent image between the electrostatically imageable surface and the conductive receiving surface at the point of transfer between at least about 1 mil and about 20 mils; and
   (h) fusing the transferred toner particles image to the conductive receiving surface.

2. The method according to claim 1 further comprising the steps of:
   (a) etching the non-imaged areas of the conductive receiving surface to remove the conductive receiving surface from the non-imaged areas of the conductive receiving surface on the conductor laminate; and
   (b) removing the toner particles from the imaged area of the conductive receiving surface.

3. The method according to claim 2 further comprising maintaining the gap between the electrostatically imageable surface and the conductive receiving surface at the point of transfer between at least about 3 mils and about 10 mils.

4. The method according to claim 1 further comprising maintaining at the point of transfer a first plane taken through the electrostatically imageable surface parallel to a second plane taken through the conductive receiving surface.

5. The method according to claim 4 further comprising holding the conductive receiving surface rigidly in place at the point of transfer.

6. The method according to claim 5 further comprising holding the conductive receiving surface flat at the point of transfer.

7. The method according to claim 4 further comprising holding the conductive receiving surface stationary at the point of transfer.

8. The method according to claim 7 further comprising holding the electrostatically imageable surface stationary at the point of transfer.

9. The method according to claim 7 further comprising moving the electrostatically imageable surface at the point of transfer in such a manner that there is no relative motion between the electrostatically imageable surface and the conductive receiving surface at the point of transfer.

10. The method according to claim 4 further comprising moving the conductive receiving surface.

11. The method according to claim 10 further comprising moving the electrostatically imageable surface at the point of transfer in such a manner that there is no relative motion between the electrostatically imageable surface and the conductive receiving surface at the point of transfer.

12. The method according to claim 10 further comprising holding the electrostatically imageable surface stationary at the point of transfer.

13. The method according to claim 5 further comprising using a vacuum to hold the conductive receiving surface in place.

14. The method according to claim 5 further comprising using a vacuum to hold the electrostatically imageable surface in place.

15. The method according to claim 5 further comprising magnetically holding the conductive receiving surface in place.

16. The method according to claim 5 further comprising magnetically holding the electrostatically imageable surface in place.

17. The method according to claim 5 further comprising electrostatically holding the conductive receiving surface in place.

18. The method according to claim 5 further comprising electrostatically holding the electrostatically imageable surface in place.

19. The method according to claim 2 further comprising fusing the transferred toner particle image with heat.

20. The method according to claim 19 further comprising fusing the transferred toner particle image in an oven.

21. The method according to claim 19 further comprising fusing the transferred toner particle image with directed air from an air slot.

22. The method according to claim 1 further comprising directing the charged toner particles across the gap through the liquid from the electrostatically imageable surface to the conductive receiving surface by applying to the conductive receiving surface a charge opposite in polarity to that of the charged toner particles.

23. The method according to claim 1 further comprising directing the charged toner particles across the gap through the liquid from the electrostatically imageable surface to the conductive receiving surface by applying a back charge to the electrostatically imageable surface that is similar in polarity to the polarity of the toner particles.

24. The method according to claim 1 further comprising forming the electrostatically imageable surface in a photoconductor selected from the group consisting of selenium, cadmium sulfide, cadmium sulfide overcoated on mylar and organic photoconductrs.

25. The method according to claim 2 further comprising forming a persistent latent image on the electrostatically imageable surface.

26. The method according to claim 25 further comprising forming the persistent latent image in an electrostatically imageable surface selected from the group consistig of a dry film photoresist, a liquid photoresist, zinc oxide and organic photoconductors.

27. The method according to claim 2 further comprising applying between about 200 to about 3500 volts to the conductive receiving surface to form the electric field.

28. The method according to claim 2 further comprising applying between about 200 to about 1500 volts to the conductive receiving surface to form the electric field.

29. The method according to claim 2 further comprising applying between about 200 to about 1200 volts to the conductive receiving surface to form the electric field.

30. A method of fabricating a toned pattern on an electrically isolated nonabsorbent conductive receiving surface, comprising the steps of:
   (a) establishing a charged electrostatic latent image area on an electrostatically imageable surface the electrostatically imageable surface having a first plane passing therethrough;
   (b) developing the electrostatic latent image area by applying to the electrostatically imageable surface charged toner particles of a predetermined height suspended in a liquid comprised at least partially of a nonpolar insulating solvent to form a first liquid layer with a first liquid surface, the charged toner particles being directed to the latent image area of the electrostatically imageable surface to form a developed latent image;
   (c) applying to the conductive receiving surface a liquid comprised at least partially of a nonpolar insulating solvent to form a second liquid layer with a second liquid surface;
   (d) establishing an electric field between the electrostatically imageable surface and the conductive receiving surface by connecting a D.C. voltage directly to the conductive receiving surface;
   (e) placing the conductive receiving surface adjacent to the electrostatically imageable surface and the first plane so that a gap is maintained therebetween and the first liquid surface contacts the second liquid surface to create a liquid transfer medium across the liquid-filled gap, the liquid-filled gap being of a depth greater than the height of the toner particles, the conductive receiving surface further having a second plane passing therethrough;
   (f) transferring the developed latent image from the electrostatically imageable surface at a point of transfer through the liquid to the conductive receiving surface to form a transferred toner particle image in an imaged area and define non-imaged areas where toner particles are absent;
   (g) maintaining the gap during transfer of the develped latent image between the electrostatically imageable surface and the conductive receiving surface at the point of transfer between at least about 1 mil and about 20 mils and maintaining the first plane parallel to the second plane at the point of transfer;
   (h) fusing the transferred toner particle image to the conductive receiving surface;
   (i) etching the non-imaged areas of the conductive receiving surface to remove the conductive receiving surface from the non-imaged areas of the conductive receiving surface on the conductor laminate; and
   (j) removing the toner particles from the imaged area of the conductive receiving surface.

31. The method according to claim 30 further comprising forming the electrostatically imageable surface in a photoconductor selected from the group consisting of selenium, cadmium sulfide, cadmium sulfide overcoated on mylar and organic photoconductors.

32. The method according to claim 31 further comprising forming a persistent latent image on the electrostatically imageable surface.

33. The method according to claim 30 further comprising forming the persistent latent image in an electrostatically imageable surface selected from the group consisting of a dry film photoresist, a liquid photoresist, zinc oxide and organic photoconductors.

34. The method according to claim 30 further comprising applying between about 200 to about 3500 volts to the conductive receiving surface to form the electric field.

35. The method according to claim 30 further comprising applying between about 200 to about 1500 volts to the conductive receiving surface to form the electric field.

36. The method according to claim 30 further comprising applying between about 200 to about 1200 volts to the electrostatically imageable surface to form the electric field.

37. The method according to claim 30 further comprising holding the electrostatically imageable surface rigidly in place at the point of transfer.

38. The method according to claim 37 further comprising holding the conductive receiving surface flat at the point of transfer.

* * * * *

UNITED STATES PATENT AND TRADEMARK OFFICE
CERTIFICATE OF CORRECTION

PATENT NO. : 4,786,576
DATED : November 22, 1988
INVENTOR(S) : Bujese et al

It is certified that error appears in the above—identified patent and that said Letters Patent is hereby corrected as shown below:

In column 15, at line 58, delete "tones" and insert --toner--;

In column 16, at line 17 after "area" insert --s--; and at line 23 in the word "particles" delete the "s" so it reads --particle--; and In column 17, at line 50, delete "photoconductrs" and insert --photoconductors--.

Signed and Sealed this

Nineteenth Day of May, 1992

Attest:

DOUGLAS B. COMER

*Attesting Officer*   *Acting Commissioner of Patents and Trademarks*